United States Patent [19]

Dennis

[11] 4,018,528
[45] Apr. 19, 1977

[54] PHOTOMECHANICAL COLOR PRINTING REGISTRATION

[75] Inventor: Richard John Dennis, Southport, England

[73] Assignee: John Dennis (Graphics) Limited, Liverpool, England

[22] Filed: Jan. 20, 1975

[21] Appl. No.: 542,428

Related U.S. Application Data

[63] Continuation of Ser. No. 314,938, Dec. 14, 1972, abandoned.

[30] Foreign Application Priority Data

Dec. 17, 1971 United Kingdom ............... 58614

[52] U.S. Cl. .................................... 355/77; 355/32; 96/200; 101/DIG. 12; 354/7; 354/11
[51] Int. Cl.² ............... G03B 23/02; G03B 27/08
[58] Field of Search .............. 101/DIG. 12; 354/7, 354/11; 355/32, 77, 72, 78, 79

[56] References Cited

UNITED STATES PATENTS

| | | | |
|---|---|---|---|
| 2,385,599 | 9/1945 | Ball et al. | 101/DIG. 12 |
| 2,902,770 | 9/1959 | Mulcahy | 101/DIG. 12 |
| 3,000,737 | 9/1961 | Barnhart | 101/DIG. 12 |
| 3,192,844 | 7/1965 | Szasz et al. | 355/78 |
| 3,481,736 | 12/1969 | Ruff | 101/471 X |
| 3,626,824 | 12/1971 | Kolb et al. | 354/7 X |
| 3,677,146 | 7/1972 | Nielsen | 355/79 |
| 3,695,155 | 10/1972 | Goldenpfennig | 354/11 |
| 3,704,945 | 12/1972 | Denis et al. | 355/72 X |

*Primary Examiner*—Clyde I. Coughenour
*Attorney, Agent, or Firm*—Scrivener Parker Scrivener and Clarke

[57] ABSTRACT

The invention provides a method of facilitating registration in photomechanical color printing which comprises the steps of 1. providing a set of color separations with registration holes or slots or notches avoiding the image area,
2. mounting one of the color separations in position according to a layout on a stable transparent assembly sheet or foil,
3. electronically recording the positional co-ordinates of the color separation on the assembly foil using the registration holes,
4. replacing the assembly foil of step (2) by a further stable transparent assembly foil, and
5. mounting another of the color separations in position on the further assembly foil using the recorded positional co-ordinates of the first color separation to ensure subsequent registration of the color separations.

5 Claims, 10 Drawing Figures

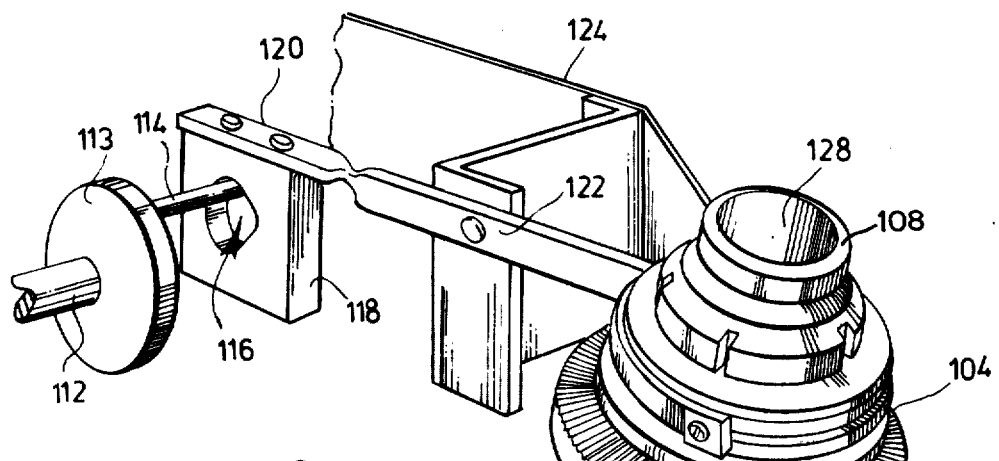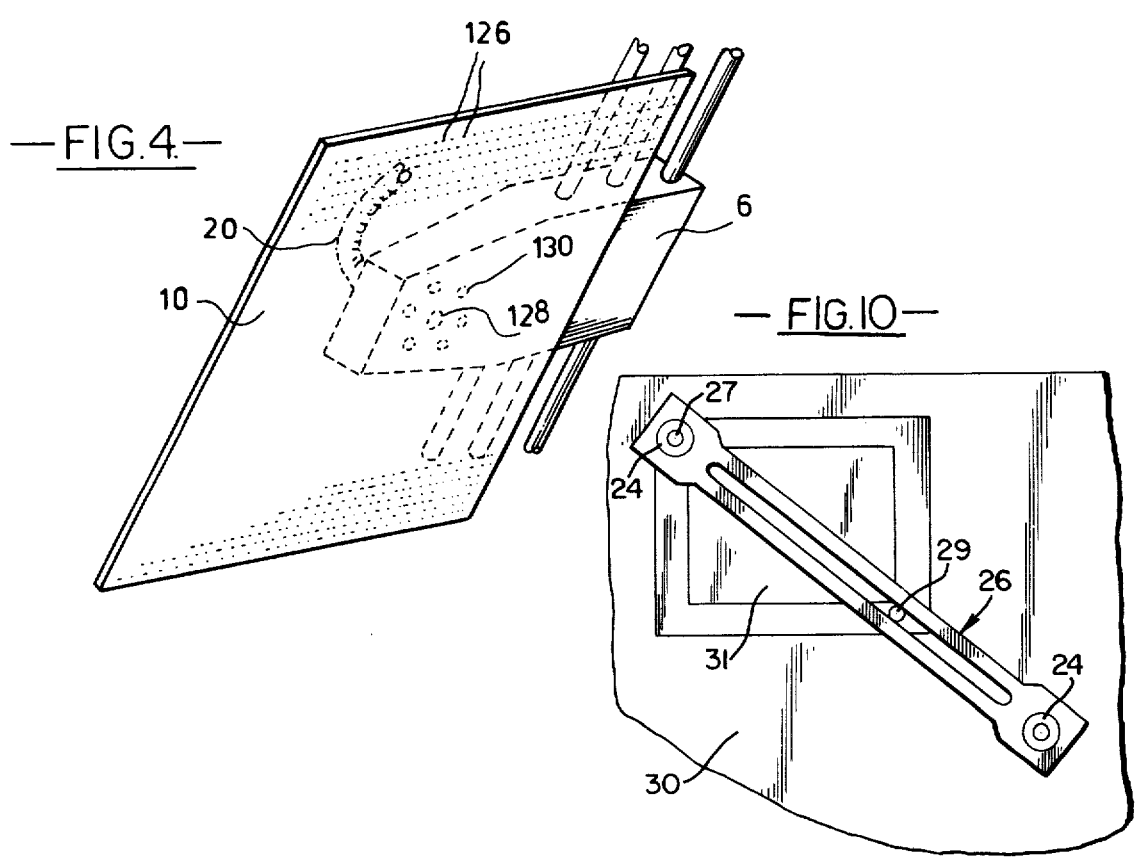

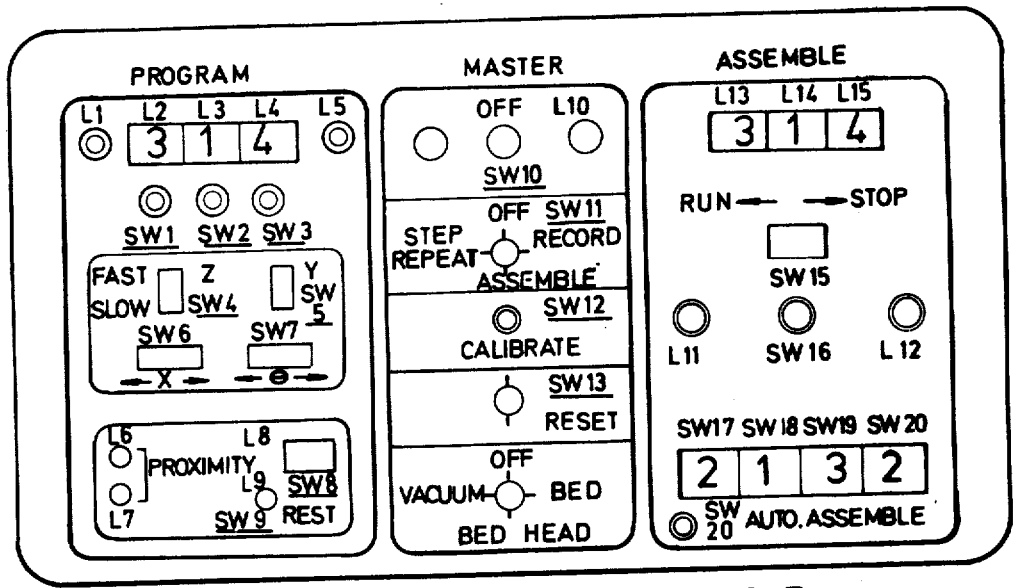
— FIG. 5 —
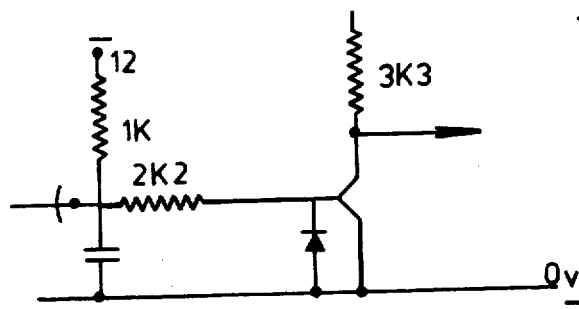
— FIG. 8 —
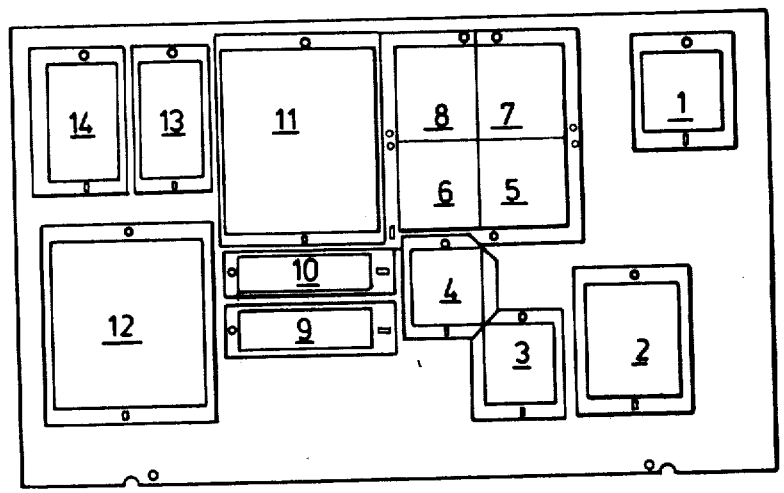
— FIG. 9 —

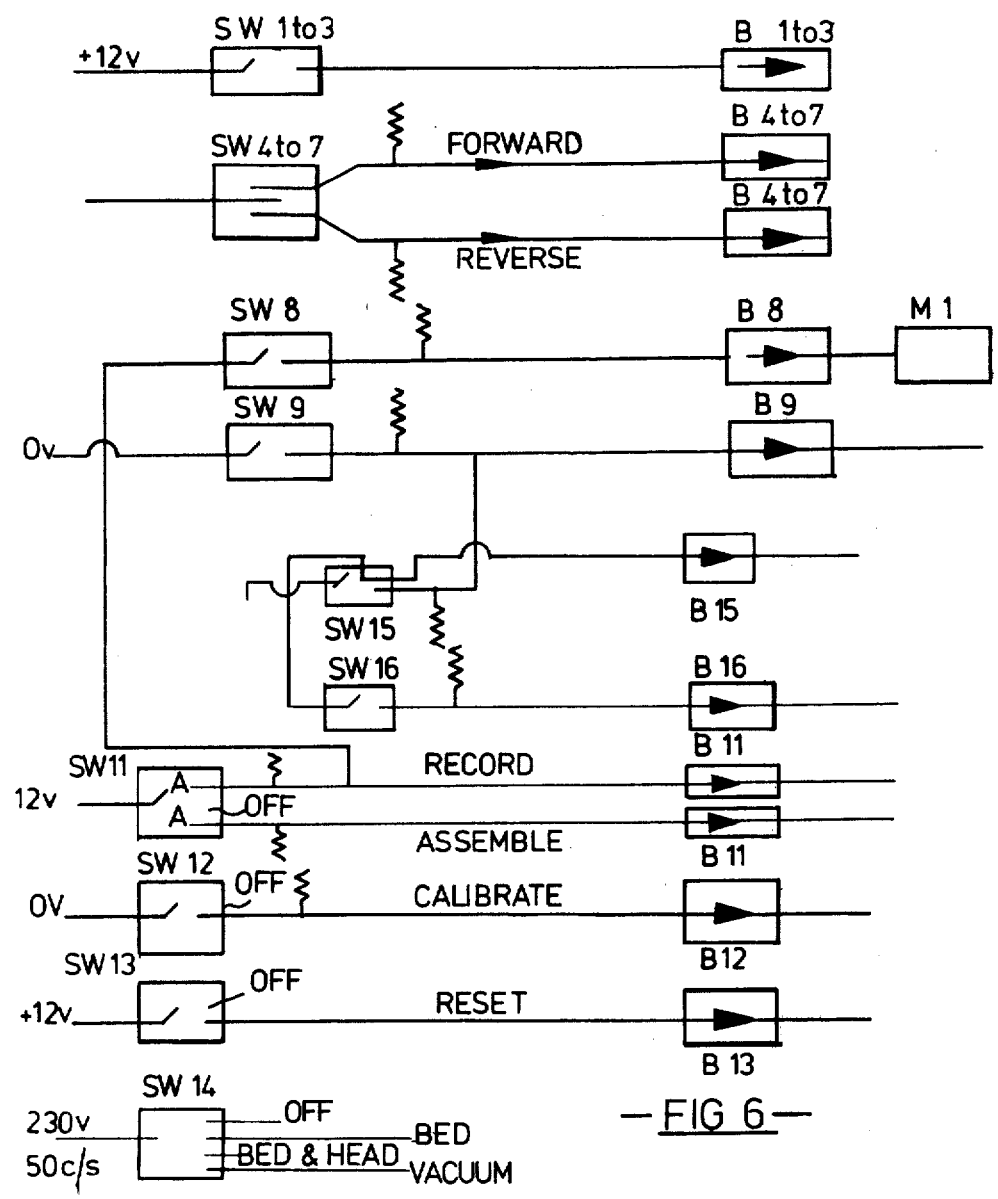

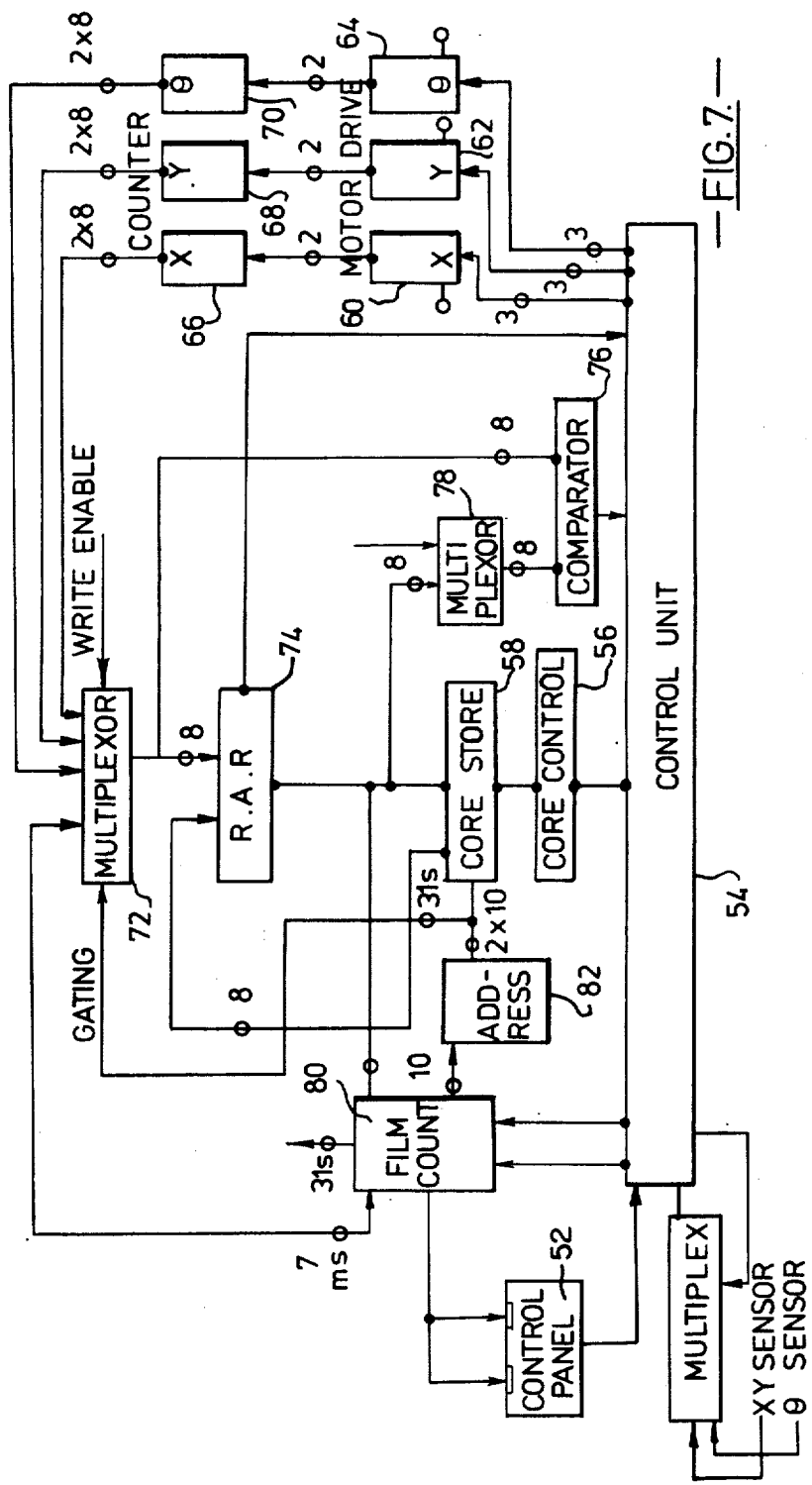

PHOTOMECHANICAL COLOR PRINTING REGISTRATION

This is a continuation of application Ser. No. 314,938 filed Dec. 14, 1972 now abandoned.

The invention also provides a registration device, for carrying out the method, comprising a motor driven head capable of movement in all directions, the head having means for holding a colour separation, and electronic means are provided for recording the positional co-ordinates of the head.

This invention relates to the graphic arts and is particularly concerned with the problem of registration in photomechanical colour printing.

In general, photomechanical colour-printing processes involve the production of a set of printing plates from a coloured original by a combination of a photographic process with a relief, planographic or recess printing process. Thus an opaque or transparent coloured original may be photographed through blue, green and red filters onto black-and-white, panchromatic film to give a set of colour separation negatives. From the colour separation negatives, a set of continuous-tone separation positives may be made for use e.g. in a gravure printing process or a set of half-tone or screen positives for use e.g. in an offset printing process. Half-tone negatives may also be made from the continuous tone positives for use e.g. in a letterpress printing process.

Four printing plates are usually made to reproduce a given coloured original. Three of these plates correspond to the blue, green and red filter separations respectively and are printed in register in yellow, magenta and cyan inks respectively. The fourth plate is printed in black in register with the other three and corresponds to a separation negative which may be obtained by photographing the original through all three filters.

Instead of reproducing one of the colour separations of a single original, each printing plate may reproduce several originals together with associated printed matter so that, for example, a complete colour brochure may be printed on a single sheet. In printing such a brochure, there is a need for an improved way of ensuring that all the originals in the layout are reproduced with the different colours in register.

There are many existing methods of assembling a layout according to a number of different subjects in their separated positive or negative form, so that the primary colours of yellow, cyan, magenta and black, plus any other colours considered necessary for faithful colour reproduction, are in register, thereby completing the colour assembly for printing in register.

In all of the existing methods the following basic principles are generally followed:

1. A layout is prepared showing a) the size of the sheet to be printed, b) the finished page size c) the position of the subjects to be printed in relationship to the sheet size.

2. The screened separations can be positive or negative. In the case of positives, the separations will be mounted on a transparent stable sheet material such as polyester or mylar. This material will be between 0.004 and 0.010 inch thick, and must permit the uninterrupted passage of ultra violet light. Negative separations will be mounted on a base as stable as that required for positive working but this material must be of a colour that will not permit the passage of ultra violet light. The image or printing areas are permitted to show through by cutting "windows" or openings in the mounting material.

Negatives can be mounted on transparent polyester sheets but the non image areas must be masked away before the assembled separations are brought into contact with the photosensitive printing plate. Assembly sheet material is hereafter referred to as "assembly foil" whether negative or positive working is involved.

Printing plates are given a photosensitive coating, which is, in general, sensitive only to ultra violet light. When the assembled negatives or positives are brought in contact with the coated plate and exposed to ultra violet light, only the background areas in positive working and the printing areas in negative working are exposed, thereby (after development and processing) leaving an image area for subsequent printing.

3. One colour is chosen as a master for assembly to the layout, e.g. cyan. All subjects appearing on the layout are then positioned on the assembly foil, which will be over the layout, using the master colour only. Therefore, when completed the assembly foil will contain all subjects in say the cyan printing only in position according to the layout.

3. A second assembly foil is affixed over the first foil containing the master colour and the next colour, e.g. yellow assembled over the first. This is done either visually or with register pins passing through punched holes provided in the film containing the screened separation.

Punch holes are used to ensure that the images appear in the same position relative to the punch hole. When this is repeated at all photographic separation stages, the punch holes can become a means of automatic location or register of images of the various separations. When register pins are fixed to the assembly foils or through a register hole punched in the assembly foil, separations containing punch holes can be located on the register pins, thereby ensuring that colour separations can be located on different assembly foils in the correct relative positions.

Other methods of location involve the making of a blue or red key which is produced on a photosensitive coated transparent base film which leaves an image in much the same manner as described at (2) except that the exposed areas appear either blue or red, and form a visual reference for laying down other separations in position.

5. The second assembly foil is removed from over the first and a third assembly foil laid over the first, firmly affixed and the next set of separations e.g. magenta positioned in register with the first set. This process is repeated until all the colour separations have been assembled on separate sheets and are ready for printing down to a photosensitive coating on the printing plate.

6. A number of companies involved in the assembly of colour separations are now adopting the practice of punching the assembly foils at the grip edge or leading edge with holes that can be located with pins.

Therefore the layout is punched also at the leading or grip edge and prepared, all assembly foils are punched at the leading or grip edge, and one by one located using register pins over the layout. Finally the plate is punched and again using register pins the assembly foils are located on the printing plate. Thus all the image areas are brought into one constant position on the various printing plates.

According to the present invention, a method of facilitating registration in photomechanical colour printing comprises the steps of 1. providing a set of colour separations
2. providing a set of assembly foils corresponding to the colour separations
3. recording the coordinates of the position of one of the colour separations on one of the assembly foils and
4. using the recorded coordinates to set out another of the colour separations of the set on another of the assembly foils in a position to ensure subsequent registration of the colour separations.

The coordinates may be recorded by electronic means.

In a preferred form of the invention, a method of facilitating registration in photomechanical colour printing comprises the steps of 1. providing a set of colour separations with registration holes or slots or notches avoiding the image area,
2. mounting one of the colour separations in position according to a layout on a stable transparent assembly sheet or foil,
3. recording the positional coordinates of the colour separation on the assembly foil using the registration holes
4. replacing the assembly foil of step (2) by a further stable transparent assembly foil, and
5. mounting another of the colour separations in position on the further assembly foil using the recorded positional coordinates on the first colour separation to ensure subsequent registration of the colour separations.

In like manner, the remaining colour separations in the set may be mounted in position on assembly foils in register with the first separation. Similarly, where the layout includes several coloured originals, several corresponding sets of colour separations may be provided with registration holes, and each transparent sheet may have mounted on it in accordance with the layout several colour separations of a given colour, there being one separation from each set.

In providing the colour separations with registration holes, each set of colour separations may be assembled in register and the holes made, e.g. punched through the set while in register. The holes will normally be made in one or two edges of the separations. More than one size or shape of hole may be made in each set of separations.

The assembly foils on which the colour separations are mounted, may also be provided with registration holes passing through the assembly foils at one edge and corresponding holes may be made in the printing plates, before the separation images are transferred to the plates, so as to ensure that the plates are printed in register.

When punch register has been used through all stages of separation and a set of e.g. screened separations produced for assembly, the punch holes should be used to register all images with register pins. Having registered all the separations one on top of the other, the complete set will be re-punched with a special punch designed to produce two sets of register holes in the film base of the separation. When a set of e.g. screened separation negatives or positives have not been punched for register through origination stages, the screened separations must be visually registered one with the other prior to punching.

The invention includes a registration device for use in photomechanical colour printing which comprises a head mounted for movement in all directions and preferably motor driven, the head having means for holding a colour separation, and means are provided for recording the positional co-ordinates of the head. The co-ordinates may be in two dimensions or three dimensions.

The means for recording the positional co-ordinates may conveniently be the memory store of a computer. The co-ordinates may be cartesian co-ordinates $(x, y, z)$ or polar co-ordinates, for example cylindrical polar co-ordinates $(r, \theta, z)$, or a mixture of these $(x, y, \theta)$.

The invention includes facilitating registration by using the movable head of the registration device to place a colour separation in a predetermined position on an assembly foil, the co-ordinates of the position having been previously determined by the registration device.

Thus, where a colour separation has been placed in position on the first of a set of assembly foils, the co-ordinates of this position may be recorded by the locating device on lowering the head to the position. Other colour separations of the same picture may then be placed by the head in corresponding positions on other assembly foils of the set in accordance with the previously recorded co-ordinates of the first colour separation.

The head may be used to pick up the colour separations which it holds prior to placing them in position on the assembly foils. The colour separations may be held in sequence in or on a magazine from which the head picks them up. The colour separations may be picked up and held in or on the head by pneumatic means, and initial location of the colour separations on the head may be effected by always moving the head from the same predetermined or "zero" position to pick up the colour separation from the magazine.

A register table may be provided to support the assembly foils while the colour separations are positioned on them. Register pins may be provided on the register table and corresponding holes provided in the assembly foils for locating the foils on the register table. In the case of the first assembly foil, each colour separation is provided with register pins passing through registration holes in the colour separation, and the head is provided with means, exemplified below, to locate the register pins of the colour separation thus positioning the head while the registration device records the co-ordinates of the colour separation by virtue of the position of the head. Having recorded these co-ordinates, the locating device can then place corresponding colour separations in the same position on the other assembly foils. Once they are in position, the colour separations may be secured to the assembly foils by adhesive tape or by welding.

To enable the head to locate the register pins of the colour separation, a target or cursor may be fitted on the register pins. This cursor may include magnetic material, and sensors for the magnetic material may be located in the head to enable the head to locate the magnetic material and hence the register pins. Thus the cursor may be in strip form with a disc of magnetic material at each end. A pin hole may be located in one disc to enable it to fit on one of the register pins and a slot may be located in the cursor between the discs to enable it to fit on a second register pin, two pins being sufficient to determine the position of the colour separation. The distance between the register pins will depend on the size and shape of the colour separation and the slot in the cursor enables it to accommodate a range of distances between the pins. The sensors may be electrical coils positioned round the z axis of the head.

The magazine may also be provided with register pins which pass through register holes in the colour separations held in the magazine in order to locate the separations in the magazine. Two pins may conveniently be used and it is advantageous for the position of one of these pins in the magazine to be adjustable e.g. slidably mounted. The magazine may be secured to the register table. Preferably the pins are spring loaded to enable them to be depressed by the head so that it can move into contact with a colour separation in the magazine and pick it up by vacuum. It will be appreciated that in the case of a first assembly foil bearing several colour separations in accordance with the layout, the registration device can be programmed so that the head can record the co-ordinates of each colour separation in turn and subsequently assemble the corresponding colour separations in position on the other assembly foils.

In addition to the register table, a separate planning table may be provided for planning the layout for the assembly foils, and assembling the separations on the first foil.

As previously stated, the head is mounted for movement in all directions. Preferably, the head is rotatably mounted for $\theta$ motion on a carriage (the $x$ carriage) slidably mounted for $x$ motion on another carriage (the $y$ carriage) which is slidably mounted for $y$ motion on the registration device. In addition to being rotatably mounted on the $x$ carriage, the head is also slidably mounted for $z$ motion on the $x$ carriage. While $x, y$ and $\theta$ co-ordinates are sufficient to record the position of a colour separation on an assembly foil on the registration table, the $z$ motion is provided so that the head can home onto the cursor or pick up a colour separation from the magazine and place it in position on an assembly foil, in other words, so that the head can move to and from its co-ordinate positions. The $z$ motion is at right angles to the plane of the registration table, which may conveniently be inclined to the horizontal.

On large offset sheet fed presses which may be used at the colour printing stage it is possible to encounter "fan out" on the back edge of the sheet. This is caused by paper stretch and can only be countered by allowing for stretch at the assembly stage. For this purpose, it is possible to build into the computer a facility to step each individual separation or illustration out of register to counter for such paper stretch.

The invention will now be further described by way of Example with reference to the accompanying drawings in which FIG. 1 is a general perspective view of a registration device, FIG. 2 is a perspective view of the mechanism of the device of FIG. 1, FIG. 3 is a perspective detail of part of the mechanism shown in FIG. 2, FIG. 4 is an inverted view of the head showing the sensors, FIG. 5 is a front view of the controls of the control panel shown in FIG. 1

FIG. 6 is a block diagram of the wiring between the control panel and the control unit of FIG. 7.

FIG. 7 is a block schematic of the electronic control system,

FIG. 8 is a detail of FIG. 6 showing a typical buffer circuit,

FIG. 9 is an illustration of a layout.

FIG. 10 is an enlarged broken view of a detail of FIG. 1.

Figure 1:
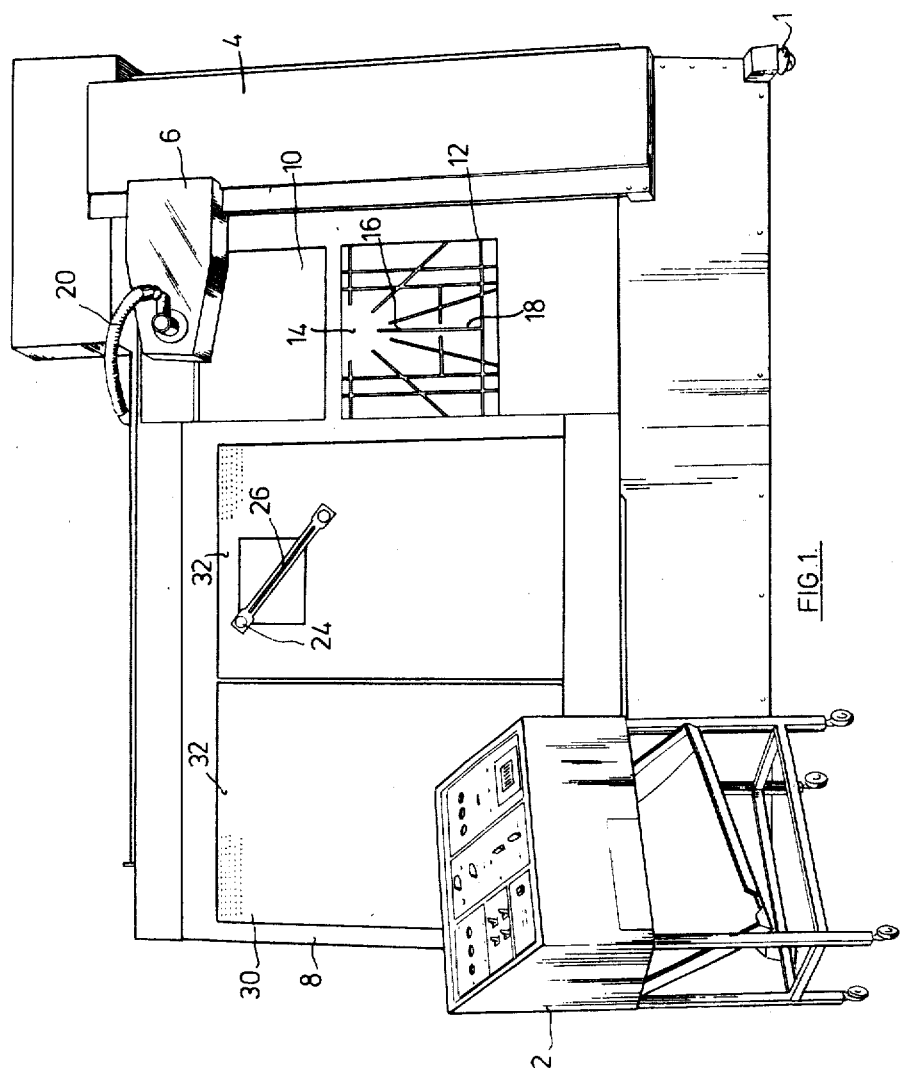

A control panel 2 and a vacuum table 8 having leveling feet 1 are shown in FIG. 1. A colour separation which is to be deposited upon the vacuum table 8 is first positioned in a magazine 12. The colour separation is located in position on the magazine 12 by a fixed datum pin 14 and a pin 16 slidably mounted in a groove 18 formed in the magazine 12. A vacuum head 10 whose purpose is to transfer the colour separation from the magazine 12 to the vacuum table 8 is attached to a Y carriage 6 which is slidably mounted on an X carriage 4.

Two pins 23 are located in the top half of the vacuum table 8 and serve to secure on assembly foil 30. A perspex cursor 26 having a disc 24 at each end is positioned on the assembly foil 30 in a predetermined position. As more clearly shown in FIG. 10 each disc 24 which serves as a target for sensors in the vacuum head 10, has a hole through its centre for accommodating a registration pin 27 of a colour separation 31 which is pressed into the vacuum table. The cursor is further secured in position by a pin 29 which is adjustable in a slot formed between the two longitudinal ends of the cursor 26. A pipe 20 connected to a vacuum pump (not shown) is attached through the Y carriage 6 to the vacuum head 10. The vacuum head is hollow having a plurality of small holes in its base and enables the colour separation to be held in position on the base of the head by the differential pressure across the colour separation.

The vacuum table 8 has a vacuum valve (not shown) positioned on the left periphery of the vacuum table as shown in FIG. 1. This valve is used to select the section of the table on which the colour separation is to be deposited.

Figure 2:
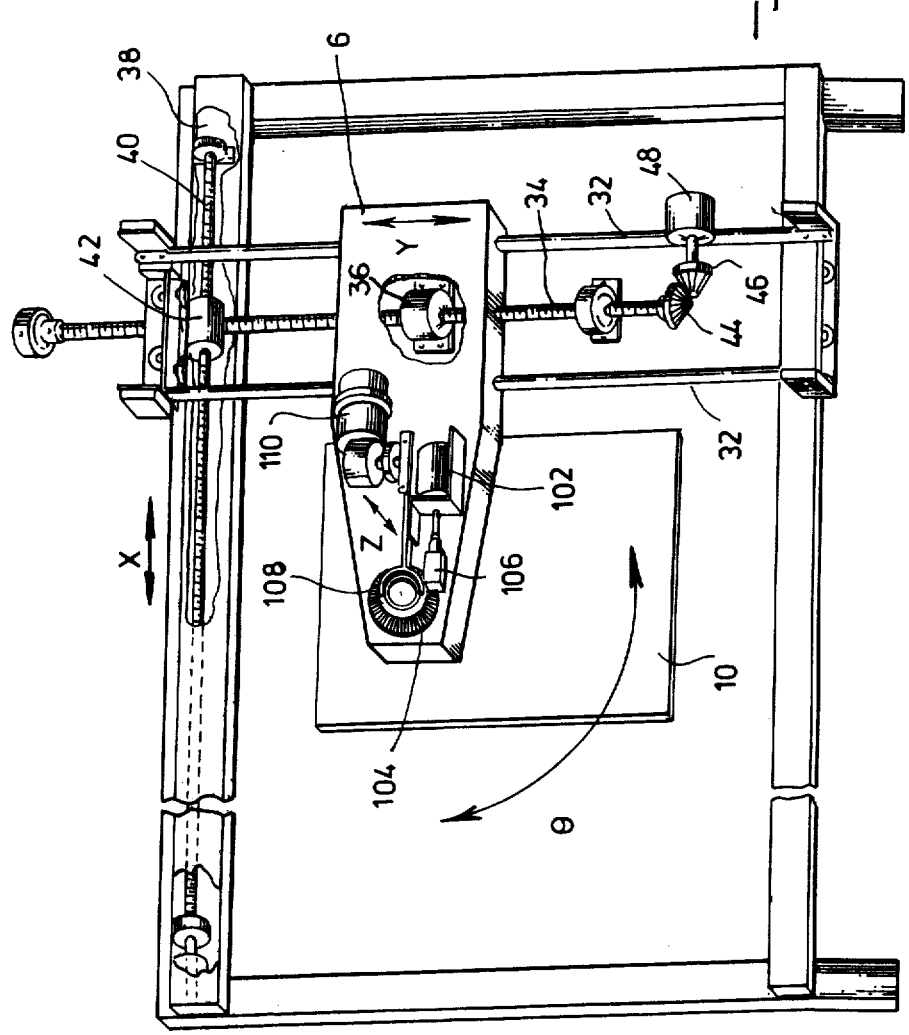

The Y carriage 6 in FIG. 2 is slideably supported on bars 32 and is mounted on a threaded bar 34 by means of a nut 36 mounted on the Y carriage. The X carriage is slidably mounted on a threaded bar 40 by means of a nut 42.

The end of the threaded bar 34 remote from the X carriage has a gearing 44 which cooperates with a gearing 46 positioned on the end of a shaft from a Y stepping motor 48. When the motor 48 is operated the threaded bar 34 rotates and the Y carriage moves up or down in the Y direction depending upon the motor direction. Similarly an X stepping motor 38 is used to rotate the threaded bar 40 resulting in the movement of the X carriage. The bars 32 have their ends attached to a bracket, the bracket having vertical and horizontal wheels attached thereto which roll in grooves on the edge of the vacuum table. The grooves are parallel to the threaded bar 40 and facilitate the movement of the X carrige in the X direction.

The head 10 can rotate about an axis Z which is perpendicular to the surface of the head, as well as the X and Y directions. This is achieved by the action of a O stepping motor 102 which has a gear wheel 106 at the end of its shaft. The gear wheel of the O motor engages with the teeth of a gear wheel 104 which is attached to a hollow shaft 108 which is itself attached to the head 10. Thus the motion of the head 10 and the gear wheel 104 rotate in synchronism.

Referring to FIGS. 2 and 3 a motor 110 is used for moving the head up or down in the Z direction. FIG. 3 shows how this is achieved. The shaft 112 of the Z motor 110 has a cam 113 to which is connected an eccentric bar 114. The end of the bar 114 remote from the cam 113 is located in a curved aperture 116 formed in a thrust member 118. The thrust member 118 is bolted to the end of a lever 120 remote from the hollow shaft 108 which is connected to the head 10. The lever 120 is pivoted at a pivot 122 attached to a bracket 124 of the Y carriage. Rotary novement of the eccentric bar 114 about the axis of the shaft 112 results in reciprocating movement of the shaft 108 and thus the head can be removed from or lowered to the vacuum table.

The cylindrical hole 128 which extends through the shaft 108 attached to the vacuum pipe 20. When the head 10 has its interior depressurised then suction occurs through holes 126 (FIG. 4) in the base of the head. It is this suction which enables the colour separations to be lifted from the magazine and deposited upon the vacuum table.

The base of the head has six solenoid coils 130 arranged symmetrically in its surface for detecting the target disc 24. The six coils form three pairs of sensors for detecting the X Y and $\theta$ coordinates of the target respectively. The coils of each pair being positioned diametrically opposite each other.

FIG. 6 shows the wiring diagram of the wires between the various switches on the control panel and associated buffer stages in the control unit.

The switches SW(1 to 3) are monopole switches used to connect a +12 volt supply to respective buffers B(1 to 3) by way of circuit board 6 of the control unit.

The switches SW(4 to 7) are dipole switches each pole of which is connected to respective buffers B(4 to 7) by way of circuit board 7 of the control unit.

Switch SW8 is a monopole switch which connects the record wire of a four pole switch SW11 to a one shot multivibrator by way of a buffer B8 and a circuit board 5 of the control unit.

A monopole switch SW9 connects a buffer B9 to earth via circuit board 5. The line between SW9 and buffer B9 is connected to one pole of a dipole switch SW15 for connecting buffer B9 to the assembly wire of the four pole switch SW11. The other pole of SW15 is connected to buffer B15 and can connect B15 to buffer B16 via monopole switch SW16. The record and assemble wires of the switch SW11 are connected to respective buffers B11 by way of circuit board 5 of the control unit.

The monopole switch SW12 is used for connecting a buffer B12 to earth. The dipole switch SW13 connects a buffer B13 to a +12 volt supply. The four pole switch SW14 connects the mains supply to the bed, head and vacuum pump of th system.

FIG. 8 is a buffer stage as used in FIG. 6. It essentially comprises an npn transistor BC108. This transistor is switched off by the closing of the respective switch SW4, 5, 6, 7, 8, 9, 11, 12 15 and 16.

The method of carrying out the photomechanical colour printing will now be described.

The first stage is to draw out an accurate and detailed layout. The layout material is selected so as to be thin, transparent and as stable as possible.

The initial layout should contain the following information:

1. show the first line of print (or first cut)
2. show the centre line
3. show the sheet size and page dimensions both trimmed and untrimmed.
4. show the illustration positions with bleeds.
5. show the text position.

The non assembly information (1 to 3) is drawn into the layout in a contrasting colour to the assembly information (4 to 5) as shown in FIG. 9 each illustration is numbered from 1 upwards.

FIG. 9 shows how the finished layout is placed on an assembly light table located on register pins at the end of the second stage.

At this stage it is necessary to decide where new pin; holes are to be punched. New register holes are required to enable (1) programming the computer and (2) location at assembly stage of films into the magazine.

New pin register holes must be punched into the separations (1) where they do not interfere with the next illustration and (2) a distance apart at least two thirds of the illustration length.

FIG. 9 shows the pin positions marked on the layout. The holes are, one round and one slotted. This is to prevent assembly with illustrations turned inadvertantly through 180°.

Wherever possible pin holes are situated across centres or across corners.

Having decided where the new pin positions are to be positioned, the third stage is to punch the various colour separations.

The film punch consists of one fixed punch, punching and 1/8 (0.125 inch) round hole, and one movable punch punching a slotted hole ⅛ × ⅜ inch (0.125 × 0.250 inch).

Both punches are mounted onto a rigid light box which is intended to be portable and used on a light table.

Punching sequence is as follows:

(1) Ensure that all the colour sets for the sheet to be assembled are to hand, and preferably mounted on pin bars or loose pins (this assumes that colour sets have come from the camera using a pin register system - registering colour sets with no camera register holes is dealt with later on).

2. Place one separation from the first set over its position on the layout.

Using a fine felt tipped pen mark the location of the round and slotted holes.

3. Replace the marked separation on to the pin bar or loose pins and place the registered set onto the punch plexiglass surface.

4. Move the round hole mark under the fixed punch and bring up the moving slotted punch until it is over the other mark on the film.

5. Clamp the four films into position and punch.

6. Examine for register and pass on to set number 2 requesting nos. 2-6 until all illustrations are complete.

Where a set of separations is supplied without punch register holes from the camera, or where the existing punch holes do not give accurate register, then the following will apply:-

1. Place one separation from the set in position on the layout. Using a fine felt tipped pen mark the location of the round and slotted holes.

2. Place all four separations roughly in register one over the other and ensure that there is sufficient margin around the subject on all four pieces of film to accommodate the new punch holes.

3. Position the marked separation onto the punch plexiglass surface and placing the mark for the round hole under the fixed punch position and slide the moving slotted punch up until it is over the second punch mark.

4. Tape this separation firmly to the plexiglass.

5. Register the second separation of the set to the first clmapdown and punch both pieces of film.

6. Release the clamp and take away the second separation film. Take the third piece of film and repeat stage 5.

7. Repeat stages 5 and 6 until the set is punched.

8. Place the set on loose pins and check for accuracy.

The four stage is to assemble a key colour, usually cyan.

Punch a sheet of assembly foil at the grip or leading edge, locate this on register pins over the layout, both being situated on an assembly light table.

Place each illustration into its position and tape down.

It is advisable to trim away unwanted areas of film at this stage. However, when films are required to butt together allow a small overlap. Final trimming will be accomplished after all four assembly foils have been completed on the electronic register table.

By using the Dennis film cutter it is possible to trim each piece of film accurately to the same size.

With all illustrations in place, firmly taped and checked next place register pins, one round and one slotted through the pin holes in the film.

All preliminary work prior to programming has now been completed.

Stage 5 is to take the fully assembled key colour to the table. At the top of the table will be found a bar with pins corresponding to those used on the assembly foil, produced by punching with a plate/foil punch.

Hang the assembled foil onto the pins, ensure that the sheet hangs flat against the table, select the vacuum size required and switch on vacuum.

The key assembly sheet is now firmly held against the table.

Stage 6 is the programming.

1. Turn the knob SW1 to "Record" and the knob SW2 from off position to "Reset". This will reset any previous programme from the memory banks. The progamme counter will read 01, the assembly counter will read 00.

2. The perspex Target Unit with an ⅛ inch hole at one end and a long slot is placed over the pins on illustration No. 1. The ⅛ inch hole is placed over the round pin and the slot located over the ⅛ × ¼ inch pin.

The slot is intended to accomodate varying distances between the round and slotted holes in films.

At either end of the Target Unit is located a magnetic disc. These are used for automatic location of the head over the pin positions. There are sensing devices in the head which will automatically lock on to the magnetic discs. This is explained in more detail further on.

3. The head is now driven manually until the centre of rotation (pivot point of the head), is over the round pin. A visual device is included in the head shaft to aid location.

This location is horizontal and vertical and controls are supplied for the operator to move the head in both directions at once. When the centre of rotation of the head is located over the round pin this will have established the vertical and horizontal positions known as the X and Y coordinate.

The head is then rotated until the "proximity" warning is alight. All movement controls are then released.

The operator must then depress the "Home and record" button. The automatic sensing device in the head will then make final adjustments to achieve perfect location over the magnetic discs.

When the head finally rests in perfect location over the magnetic discs, a signal will be sent to the computer and the head position will be recorded in horizontal (X coordinate), vertical (Y coordinate) and rotary (O coordinate) positions.

The programme counter will then move to 02 and the assembly counter will move to 01. NOTE The programme counter always shows the next number available or next illustration to be recorded. The assembly counter shows the number of illustrations that have been recorded. Stage 7 involves manually driving the head away from the pins of illustration 1 and clear of the pins protruding from illustration 2.

Place the Target Unit over the pins in illustration 2 and repeat the operations described in Stage 6. Stage 8 repeat the same procedure until all illustations have been recorded. Ensure that the number sequence as marked on the layout has been carefully followed. Following completion of the last illustration push the "Return Rest Position". NOTE: In the event of a mistake being found which will require alteration to be made to the programme for an illustration, follow the following steps: Assume that illustation No. 09 is to be altered.

a. Make the alteration to the illustration position - ensure that pins are left through the pin holes.

b. Turn the programming counter back to 09. Note that the red warning light will now light up.

c. Carryout the normal programming procedure explained in Stage 6. The computer will automatically erase the old 09 coordinates and substitute the new coordinates.

d. The red warning light will show until the counter has been advanced and returned to its old position. The green bulb will now light up, showing that the computer is free to accept another set of coordinates. Stage 9 is the assembly, the programme is now complete and the computer is ready for assembly.

a. Turn off the bed vacuum, and remove the key assembly sheet, strip away all the illustrations and carefully collate in number sequence in four separation sets of film.

We recommend that the illustrations are collated in the following sequence: CYAN, MAGENTA, YELLOW, BLACK - all emulsions facing upwards. b. Place the first collated set into the film hopper ready for assembly. c. Punch a piece of assembly foil using the plate/foil punch. Locate it on the pins at the head of the vacuum table, smooth down the assembly foil, and switch switch on the bed vacuum. d. Turn the switch SW1 to ASSEMBLE.

The programme counter will not turn to 01 and the assemble counter to "OO". Pass the fiber through the adhesive machine.

e. Load the film No. 1 into the magazine, emulsion up, round pin over the fixed round pin at the top of the magazine. The slotted pin sliding in a track should now be moved up and engaged in the slotted hole in the film.

The film will not be positioned in the computer "zero" position.

f. The head at this time will be in the reset position, above the magazine. On pressing the assemble button the head will move from the rest position to the magazine. The head will be positioned by the computer to "zero" position and lowered to contact with the film.

As the head lowers it will engage two lugs for positive mechanical action. This action will also automatically calibrate the computer to zero.

The pins holding the film in place on the magazine are spring loaded and will depress under pressure from the head.

As the head comes into contact with the film, a micro switch will start the vacuum pump feeding suction to the film head. The film will be picked up by the head.

The circuitry of the head mechanism is arranged to allow 1–2 seconds delay after the film has been picked up, before the head lifts and moves away. g. The head with the film held firmly by suction will now move automatically to position number 01. The computer has stored position no. 01 ($x$, $y$ and $\theta$ coordinate positions) and will take the film to exactly the place used for programming. h. When the film is lowered into position and in full contact, a micro switch will turn off the vacuum pump allowing the film to be left in position on the assembly foil. The head will then return to rest position.

The gramming counter will allance to 02 (next number available) and the assembly counter will advance to 01 (number assembled).

While the head is moving to its coordinate position a warning orange light will show next to the assembly button, after the head has deposited the film a green light will show, indicating that the computer is ready to accept a command to pick up illustration No. 02. i. As soon as the film head has picked up the first illustration and moved away from the magazine, the operator is free to load illustration No. 02 on the magazine pins. This is done in the same way as described in stage e). j. As soon as the orange light to the right of the assemble button goes out, and the green light to the left comes on, the operator should press the assemble button. The head will at that time be returning to rest position.

Pressing the assemble button before the head returns to rest position, instructs the head to proceed direct to the magazine and pick up the next piece of film. k. Repeat this procedure until all illustrations are complete. Remove the assembled foil, punch a second foil and lay it over the bed pins, switch vacuum on and load the second set of separations (MAGENTA) into the hopper.

When the computer has completed a sequence of assembly, it will automatically re-zero the counters 01 on programme and 00 on assemble. 1. Proceed with assembly of the second set in the same way as described above and later the remaining two colours.

Following assembly of all four foils Stage 10 involves the following two tasks
 a. The addition of dry text
 b. preparation of a burn out mask.

These should be done on an assembly light table on the appropriate foil, over the layout. Stage 11 involves checking, while carrying out stage 10 it is a good practice to check that all illustrations have been assembled correctly i.e. in their correct positions, colour sequence etc.

Should an error be found for example C9, it is simple to rectify.

Replace the assembly foil on the table, over the register pins at the head of the table, and turn on the vacuum.

Turn back the programme counter to 09, place the film into the magazine and press the assembly button. The head will then pick up the film and reimpose exactly as the original programme and exactly the same as the other three separations in the set which are correct.

Referring to the figures a control panel 52 on which is located the controls switches for the operation of a computer which may be used with the invention, is connected to an input of a control unit 54. The control unit 54 is connected to an input of a core store 58 by way of core controls 56 and to three stepping motor 60, 62 and 64. The two motors 60, 62 drive the head along the x and y axes respectively whilst the third motor 64 rotates the head about the z axis. Each motor 60, 62 and 64 is connected to a respective counter 66, 68 and 79 which monitors the movement of the head in its respective direction. The counters 66, 68 and 70 are each connected to a respective input of a multiplexor 72 whose output is connected to an input of a read around register 74. The output from the register 74 is connected to a further input of the core store 58 enabling the co-ordinates of the head at any one time to be fed to the core store 58 when an appropriate command signal from the core store 58 is fed to the read around register.

In this way the co-ordinates of the assembled colour separation or films are stored in the core store 58.

In order to assemble a further film on top of the first colour separation it is necessary to continually compare each co-ordinate of the head with the previously stored co-ordinates. This is done by way of the comparator 76. The co-ordinates stored in the core store 58 are fed to an input of the comparator 76 by way of a multiplexor 78. The stored co-ordinates are then compared with the co-ordinates of the head which are fed to a further input of the comparator 76 from the multiplexor 72. If the co-ordinates do not correspond the comparator 76 transmits a signal to the control unit 54 which transmits a step pulse to the associated motor. The head is thus moved to a new co-ordinate which is again compared in the comparator 76 with the fixed co-ordinate in the manner described above.

The co-ordinates of the head at any one time are monitored by sensors in the head and are fed to the core store 54 by way of a multiplexor 84.

In addition to storing the co-ordinates of the films the core store 58 also stores the number of the film. As each film is taken from the magazine a signal from the control unit actuates a film counter 80. The number in the film counter 80 is displayed on the control panel and is stored in the core store 58 by way of an address register 82.

The speedmaster 2000 operates in two major modes, namely a programming routine followed by an assembly routine.

The programming routine consists of two modes - 1 Manual control, including fast and slow movement. 2 Automatic homing control which also generates a "Record" signal to store the co-ordinates.

The assembly routine consists of four automatic step sequencies.
 1. Go to magazine and pick up film.
 2. Move to co-ordinate.
 3. Enter a deposit routine.
 4. Return to "Rest" or "Magazine".

Relating the programming operation to the block schematic from switching the power on the sequence is 1. Operate the "Reset" on the control panel this sets the "Film Count" to unity and sets other logic sequencies in the "Control Unit" into their initial states.
2. Select "Record" on the Control Panel - this enables the programming controls.
3. Manually drive the head into proximity of the target unit - this is shown by a feed back from the sensors which set warning lights on the control panel.
4. Operate the "Home & Record" - this hands the motor control to the control unit which sets up a drive sequence which, together with the feed back from the sensors exactly position the head over the target unit.

Each of the $x$, $y$ and $\theta$ motors is associated with an up/down counter such that every step taken by a motor in the forward direction increments the appropriate counter and every step in the reverse direction decrements the counter. The counters are set up initially with the head in the "Rest" position so that all movement from that reference point add onto the counters. In this manner the position of the head is always known with reference to the "Rest" position. When the head has been positioned exactly over the target unit the contents of the three counters are written into a core store via a "Write" routine, which also increments the film count display on the control panel. This completes a programming routine.

Relating the assembly operations to the Block Schematic the sequence is as follows -

1. Select "Assemble" on the control panel - this enables the assembly controls.
2. Operate "Reset" - this again sets the film counters to unity and sets the sequencing logic into its initial state.
3. Select "Run" on the control panel - this permits an assembly routine.
4. Operate the "Carry out assembly" push button - this initiates the whole assembly routine and from this point in time the control unit logic controls the $x$, $y$ and $\theta$ motors, the vacuum to the head and the Z motion.

During the assembly routine the required co-ordinate, as read from the core store, is continually compared with the motor counters and direction and speed controls are generated. At the co-ordinate a deposit routine sets the head down and releases the vacuum to the head. The head then raises and returns.

There are facilities on the control panel to stop the head at any time during assembly or programming and return it to "Rest". Also the film counters can be set manually, in which cases the previous count is stored and can be read out and reloaded into the film counter via the "Next Free" push button. There is also a manual vacuum control on the control panel.

The control unit essentially comprises four logic circuit boards which will hereinafter be referred to as boards 4, 5, 7 and 8.

The operation of the programming and assembly routine will now be described further with reference to the control panel wiring and control panel identification drawings.

When an operator initially programmes the machine the head will be in its rest position which is directly above the magazine. The operator switches on the machine and then turns switch SW11 to the record position. This procedure activates the control switches located on the programme half of the control panel.

The manual control of the head is via switches SW4, 5, 6 and 7. SW4 serves as a two speed control switch for the head whilst SW5, 6 and 7 serve as the vertical, horizontal and rotational control switches respectively. After switching on the machine there will be stray signals in the logic circuits of the control unit and to eliminate these stray signals the operator turns switch SW13 to reset and back to off. This switching has the effect of resetting the counters and the logic circuits into their initial conditions.

Having reset everything to the initial position the operator will place his master plan of the page layout onto the vacuum table and will place the target unit onto the first negative.

The target unit comprises a perspex strip having a mild steel disc inserted in its surface at each end. The steel disc serves the target for six solid sensor coils located in the head, the six solenoid coils forming three pairs of sensors for the $x$, $y$ and $\theta$ co-ordinates respectively and are arranged symmetrically about the z axis.

Starting with the head in its rest position the operater drives the head manually from its rest position to target disc. To do this for the horizontal forward movement of the head the operator must switch SW6 to the left as shown on the control panel drawing. This will generate an access signal which is transmitted to circuit board 7 and sets the motor direection into the forward mode. A signal CXD (not shown) is generated on board 7 (not shown) and is transmitted to board 8 (not shown) where it is combined with a slow control signal SS (not shown) or a fast control signal FS (not shown) which are set by SW4. The resultant signal which will hereinafter be referred to as signal FSX and SSX (not shown) respectively goes to the motor drive to start the $x$ motor and cause the head to move at a fast or slow speed in the horizontal direction. A similar procedure is used for moving the head at a fast or slow speed in the reverse direction. Actuation of the $y$ and $\theta$ motors is accomplished in a similar manner by switching SW5 and SW6 respectively.

If the target unit is on the same level as the head sensors the operator would only have to drive the head horizontally and the sensors would come into proximity with the target. In this proximity position the two x-sensors have their mutual inductance changed by the target disc. Unless the two x-sensors are exactly over the target disc there will be a difference in their mutual inductances. This difference is fed into a differential electromagnetic circuit which will continually step the head in the x-direction until the mutual inductance of the two x-sensors is identical. Similar control of the y and $\theta$ motors is achieved using the y and $\theta$ sensors.

When the x-sensors come into proximity with the target the sensor logic generates a proximity signal which is fed back to board 7 and shuts off the fast signal FS to produce the slow signal SS in its place.

When the differential electromagnetic circuit is balanced the head is then in position and the film can be deposited. The co-ordinates of the heat are then stored in the core store by way of the read address register.

This means that it is not possible to drive through the proximity area in the fast mode. Once the x-sensors are in proximity the operator switches to the vertical or y control and by manipulating SW5 would obtain proximity in the y direction. Two proximities would then be achieved and the proximity lights L6 and L7 would be lit. When the operator has achieved this condition he is free to press the home record button SW8, to initiate the second part of the programming routine. When switched to home and record the motor controls are automatic and step on in sequence from the x drive, y drive and θ drive. When in the proximity area the direction of the head is controlled by the feed back from the sensor logic which will say whether or not the head is to the left or the right of the target position.

Pressing the home and record push button generates a signal on board 5 (not shown) which sets the store and enables the proximity sensor to take over control and also increments a two bit counter which is decoded to give the x drive.

As the motor control is now under the sensor logic control the head drives round until the sensors are in the target position. In depositing the film the head locates the register pins which are provided on the registration table for locating the assembly films. As these pins are located a data signal is generated from the head so that the co-ordinates of the film are stored in the core store. This data signal DS which comes on board 7 is a combination of the signals produced in the sensor logic by the head moving one step in the x-direction and one step in the y direction. The D.S. signal is fed back to board 5 and produces another pulse, this pulse again increments the two bit counter which is decoded to y drive and also generates another pulse which is fed back to board 7 which resets the store. When the machine is in y drive the same procedure is gone through and the D.S. signal is generated for a second time, a second pulse is generated and the counts on the two bit counter is three and this is decoded as a θ drive. When θ comes up in proximity the fourth and final D.S. signal is generated and that final pulse causes the second bit of the two bit counter to change state which triggers a further monostable wich both switches off the home record store, resets the store and provides a recording enable signal which is fed back to board 4 to produce a pulse which sets the record store. That store enables clock pulse to go to the core store and also the read around register so that the register goes through a set write routine (it writes the data into the store). When the co-ordinate is established it consists of three, sixteen bit words and as the core used is 1000 by eight bit word store the co-ordinate is split into 6 eight bit words. The film number pertaining to those co-ordinates is also stored in the core store.

To write a whole set of co-ordinates finto the core store one requires eight pulses which are counted off on a counter R (not shown) and after the eighth bit an R count end signal is generated which resets the write store (the write enable store).

The same signal which is used to clock in the data into the core store is used to increment the film counter. The film counter has seven major bits and three sub-bits (the three sub-bits represent a combination of eight possible decimal numbers). The three sub-bits are used to select the data on the multiplexor 72 which goes into the read around register.

Once the address and co-ordinates of the first film are stored in the core store, the operator would normally drive the head away from the target, take the target off and put the cursor target on a second film and home the head onto the second film as was done previously. After the operator had finished recording the co-ordinates of all the films he then pushes the return to rest push button SW9 and the head will automatically back track into its rest position.

Having done the programme the operator would then switch SW11 to assemble and reset the film counters by turning SW13 to reset and back again.

To do a first assembly the operator puts SW15 into the left position as shown on the display panel drawing and presses the active push button SW16. On closing the assemble and run switch a signal is generated which goes to board 4 and sets a store, the assemble store, this store enables a three bit counter and it also generates a clock pulse which is counted by the three bit counter. The actual count of this counter is decoded to give slow or fast x drive and θ drive. The three bit counter is binary counter and the decimal number 1 represents x fast, decimal number two represents x slow, number three represents y fast etc. The least significant bit serves as the fast/slow control when the machine is in the assembly mode. When the assemble store is set the first clock pulse is not only counted and decoded to give the correct drive but is also used on board 4 to generate a clear data register signal which clears the data from the read around register. The clear data register signal initiates a read cycle which reads out the first half of the x co-ordinate of film number 1. This is loaded in the read around register and is compared with the most significant bits of the x counter, the x counter being fed with clock pulses from the x motor drive. When the two counts are equal a signal is generated which produces a count one signal which is sent to board 4 where a further clock pulse is produced which goes through onto the three bit counter to produce a decimal number 2 which is $x$ slow. The clock pulse also produces a clear data register signal as the read clock pulse to the core store and the eight least significant bits of the x co-ordinate of the first film are then read out of the core store and into the read around register.

The read around register is a set of JK flip-flops from which the clear line is fed by the clear data register signal, the set line is set by either the data coming from the core or data fed from the multiplexor. The read around register used is a standard mullard register used with their F12 core store. The number on the associated motor counter is compared with the required count and a signal is produced to set on the count and to up-date the information, by this process the whole co-ordinate for the first film is arrived at.

Having arrived at a co-ordinate the head goes into a deposit routine. The deposit routine and the following pick-up routine is controlled by a clock and a four bit counter which is decoded to give the appropriate motor action. In an assembly mode the head moves from its rest position to the magazine to pick up the first film by reading fixed co-ordinates for the magazine. This is set up initially so that the magazine is a known fixed distance from the rest position and the head is merely turned vertically and rotated the appropriate number of steps to get to the magazine. The head would then go into the pick-up routine as previously described. Having reached the co-ordinate and depositing the film it would then go into the return mode to go back to the rest position. The return mode is set by an end count signal and the assemble routine in the store is reset. In the return mode a similar counter and decoder is used as for the assembly. In this case though no data is read out of the core store, the counters are just compared with zero and as they are up/down counters they count down until they are all zero, i.e., the head is at is rest position.

There is a further facility of the assembly mode. This is whereby the operator can arrange for the head to go straight back to the magazine instead of to the rest position. There are two lights on the right hand side of the control panel L11 and L12 indicated as free and operating. During the assembly after the head has picked up a film from the magazine and is travelling to the respective co-ordinates the operating light L12 is illuminated. After the film has been deposited at the co-ordinates and is returning to the rest position the free light L11 is illuminated. If the operator has put another film on the magazine whilst the light L11 is illuminated he can make the head return there by pressing the activate switch, in which case when the multiplexor which monitors the various counters gets to the most significant half of the y counter instead of returning the counters to zero it is turned to a fixed number which is in fact the co-ordinate of the magazine and the same as the $\theta$ co-ordinate. These two parts of the address are decoded out and processed so that the head returns to the magazine.

There is another facility on the control panel which enables the operator to stop the head at any time during either assembly or programming and to return the head to rest. This is the switch SW9 in programming and SW15 in assembly. If either of these are activated at the appropriate time the signals RESTP, meaning: rest position, and stop are generated on board 4 and these set the action which the head is currently engaged on and set the return store and return the head to the rest position. This is accomplished in a manner similar to the one in which the head is returned to rest after assembly.

There is the step and repeat facility on the assembly half of the control panel. In order to do a step and repeat the operator would first use switches SW 17, 18, 19 and 20 and on these switches he would dial in the number of steps to be taken on the horizontal and vertical modes respectively and would then drive the head to the top left hand corner of the step and repeat matrix. He would then record the coordinate of a negative and the negative to the right and directly below it so three co-ordinates would be stored in the core store. The number of steps to be taken in both x and y directions would also be known and after driving the head back to the rest position the operator would press the autoassemble button SW21 and this would cause the head to pick-up the first film and deposit it in the top left hand corner and then it will continue to do the stepping and repeating operations and by simple arithmetic derive all the co-ordinates of the remaining films.

There is another facility on the control panel this is the switches SW1, 2 and 3, which enable the operator to manually change the film count whilst he is programming. If he wants to go back to a film, that is if he realises he has made a mistake, he can change the film count with these three switches and then up-date the information for any particular film. When he presses any of the three switches the current film count is stored in a fixed call location and the warning light L5 comes on to indicate that he is going back on the programme. To recover the current film address he merely presses the next three push buttons, which on the control panel are identified by L1 and this will read out the film address from the fixed store location and load it back onto the film counters.

A further manual control is the vacuum control SW14 with this the operator can select the vacuum to go to either the bed or the bed and the head. The vacuum is also controlled by the logic during the pick up and deposit routines as there is a set sequence whereby during pick-up the head goes down and the vacuum then comes on, the head lifts up and moves away. During deposit the head goes down, the vacuum is switched on and the head lifts and returns. That concludes the operation of the Speed Master.

The purpose of this invention is to automate the process of assembling colour separations and thereby considerable increase both the accuracy and speed of the process.

I claim:
1. The method of using positional electronic recording means for registration of color separations for use in photomechanical color printing of illustrations comprising the steps of:
   1. providing a set of color separations for each illustration with registration means for each set being disposed on each separation outwardly of an image area thereon;
   2. positioning one of the color separations of a set in a registered position according to a layout on a first stable transparent assembly foil which itself is located in a registered position;
   3. positioning each of the remainder of the color separations of the set in a predetermined storage position;
   4. recording by said electronic means the positional coordinates of the predetermined storage position for the remainder of the color separations;
   5. recording by said electronic means the positional coordinates of said one color separation using the registration means of said one color separation on its assembly foil;
   6. replacing in the registered position of the first assembly foil a second stable transparent assembly foil;
   7. using the recorded positional coordinates of the first of the set of color separations and the position of storage of the remainder of said set for automatically transferring another of the set of color separations from the position of storage to a position on the second assembly foil which is in regitration with the corresponding position of the first of said set on said first assembly foil, and
   8. repeating steps 6 and 7 for each of the remaining color separations in the set.

2. A method as claimed in claim 1 in which the registration means are holes or slots or notches.

3. A method as claimed in claim 1 in which the co-ordinates are recorded in terms of abscissa, ordinate and angular orientation.

4. A method as claimed in claim 2 in which the layout includes a plurality of other colored illustrations and including the steps of providing a set of color separations with registration holes for each of said other illustrations positioning a separation of the same color from each of the other sets on said layout, successively recording by electronic means the positional coordinates of each of said other color separations, stacking other separations of the same color for each of said illustrations in said storage position and thereafter using the recorded positional coordinates of said storage position and said other color separations for transferring to, positioning and mounting in registered positions on successive assembly foils, respectively said separations of the same color for each of said other illustrations.

5. A method as claimed in claim 4 in which the assembly foils are provided with registration holes passing through the assembly foils at one edge and corresponding holes are made in printing plates before the separation images are transferred to the plates, so as to ensure that the plates are printed in register.

* * * * *